United States Patent
Adamec et al.

(10) Patent No.: US 7,872,239 B2
(45) Date of Patent: Jan. 18, 2011

(54) ELECTROSTATIC LENS ASSEMBLY

(75) Inventors: Pavel Adamec, Haar (DE); Carlo Salvesen, Massing (DE); Ivo Liska, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 298 days.

(21) Appl. No.: 12/181,171

(22) Filed: Jul. 28, 2008

(65) Prior Publication Data

US 2009/0026384 A1 Jan. 29, 2009

(30) Foreign Application Priority Data

Jul. 27, 2007 (EP) .................................. 07014813

(51) Int. Cl.
H01J 37/28 (2006.01)
H01J 37/244 (2006.01)
G01R 31/305 (2006.01)

(52) U.S. Cl. ............................ 250/396 R; 250/396 ML
(58) Field of Classification Search .......... 250/396 ML, 250/396 R
See application file for complete search history.

(56) References Cited

U.S. PATENT DOCUMENTS

| | | | | |
|---|---|---|---|---|
| 4,096,386 | A * | 6/1978 | Rempfer et al. | 250/365 |
| 4,926,054 | A * | 5/1990 | Frosien | 250/396 R |
| 5,892,224 | A * | 4/1999 | Nakasuji | 250/310 |
| 5,973,323 | A * | 10/1999 | Adler et al. | 250/310 |
| 6,232,601 | B1 * | 5/2001 | Schmitt et al. | 250/310 |
| 6,407,387 | B1 * | 6/2002 | Frosien et al. | 250/310 |
| 6,614,026 | B1 * | 9/2003 | Adamec | 250/398 |
| 6,667,478 | B2 * | 12/2003 | Frosien et al. | 250/310 |
| 6,720,557 | B2 * | 4/2004 | Frosien | 250/307 |
| 6,825,475 | B2 * | 11/2004 | Petrov et al. | 250/396 ML |
| 6,936,817 | B2 * | 8/2005 | Feuerbaum | 250/310 |
| 7,045,781 | B2 * | 5/2006 | Adamec et al. | 250/310 |
| 7,268,361 | B2 * | 9/2007 | Adamec et al. | 257/10 |
| 7,274,018 | B2 * | 9/2007 | Adamec et al. | 250/310 |
| 7,544,937 | B2 * | 6/2009 | Frosien | 250/310 |
| 2004/0056207 | A1 * | 3/2004 | Petrov et al. | 250/396 ML |
| 2007/0075257 | A1 * | 4/2007 | Kametani et al. | 250/396 R |
| 2009/0026384 | A1 * | 1/2009 | Adamec et al. | 250/396 R |
| 2009/0200463 | A1 * | 8/2009 | Degenhardt et al. | 250/307 |
| 2010/0084553 | A1 * | 4/2010 | Frosien | 250/307 |

FOREIGN PATENT DOCUMENTS

| | | |
|---|---|---|
| DE | 19845329 A1 | 9/1999 |
| EP | 01605492 A1 | 12/2005 |

OTHER PUBLICATIONS

Extended European Search Report, European Patent Application No. 07014813.5, Applicant: ICT Integrated Circuit Testing Gesellschaft für Halbleiterprüftechnik mbH, Jan. 14, 2008.

* cited by examiner

*Primary Examiner*—David A Vanore
(74) *Attorney, Agent, or Firm*—Patterson & Sheridan, L.L.P.

(57) ABSTRACT

A lens assembly having an electrostatic lens component for a charged particle beam system is provided. The assembly includes: a first electrode having a conically shaped portion, a second electrode having a conically shaped portion, and a first insulator having a conically shaped portion, wherein the first insulator comprises two extending portions towards each of its ends, and wherein the two extending portions are formed to generate a gap between the insulator and each of the adjacent electrodes.

25 Claims, 2 Drawing Sheets

ELECTROSTATIC LENS ASSEMBLY

FIELD OF THE INVENTION

The invention generally relates to a charged particle beam device and a method of manufacturing components of a charged particle beam device, particularly for inspection applications, testing applications, lithography applications and the like. Specifically, it relates to a lens assembly for a charged particle beam device, a charge particle beam device with a lens assembly and a method for manufacturing a lens assembly for a charged particle beam device.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring is often done with charged particle beams, e.g. electron beams, which are generated and focused in charged particle beam devices, such as electron microscopes or electron beam pattern generators. Charged particle beams offer superior spatial resolution compared to, e.g. photon beams, due to their short wavelengths.

The resolution of charged particle beam devices depends inter alia on the charged particle beam optics. One charged particle beam optical element, which is often used in charged particle beam devices, is an electrostatic lens or a combined magnetic-electrostatic lens. Generally, an electrostatic lens or an electrostatic lens component includes at least two electrodes with a center bore, which are bias on different potentials. In order to achieve high quality and, thereby, good imaging properties the electrodes of the lens need to be precisely manufactured and precisely aligned with respect to each other. In particular, a conically shaped objective lens, which is often used as an objective lens being a scanning charged particle beam device, can be difficult to manufacture and to align.

SUMMARY OF THE INVENTION

In light of the above, the present invention intends to provide an improved charged particle beam device, an improved method of operating a charged particle beam device, and a method of manufacturing the charged particle device.

According to one embodiment, a lens assembly having an electrostatic lens component is provided. The lens assembly includes a first electrode having a conically shaped portion, a second electrode having a conically shaped portion, and a first insulator having a conically shaped portion, wherein the first insulator includes two extending portions towards each of its ends, and wherein the two extending portions are formed to generate a gap between the insulator and each of the adjacent electrodes.

According to another embodiment, a charged particle beam device is provided. The charged particle beam device includes: a lens assembly. The lens assembly includes: a first electrode having a conically shaped portion, a second electrode having a conically shaped portion, and a first insulator having a conically shaped portion, wherein the first insulator includes two extending portions towards each of its ends, and wherein the two extending portions are formed to generate a gap between the insulator and each of the adjacent electrodes.

According to a further embodiment, a method of manufacturing a lens assembly having an electrostatic lens assembly for a charged particle beam system is provided. The method includes: providing an electrode having a conically shaped portion and a second electrode having a conically shaped portion, and aligning the first and second electrode with an insulator includes a material that has a smaller Young's modulus than the material of the first and the material of the second electrode.

Further advantages, features, aspects and details that can be combined with the above embodiments are evident from the dependent claims, the description and the drawings.

Embodiments are also directed to apparatuses for carrying out the disclosed methods and including apparatus parts for performing each described method steps. These method steps may be performed by way of hardware components, a computer programmed by appropriate software, by any combination of the two or in any other manner. Furthermore, embodiments are also directed to methods by which the described apparatus operates. It includes method steps for carrying out every function of the apparatus or manufacturing every part of the apparatus.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE DRAWINGS

Without limiting the scope of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image or to pattern a specimen.

Within the following description of the drawings, the same reference numbers refer to the same components. Generally, only the differences with respect to the individual embodiments are described.

Figure 1:
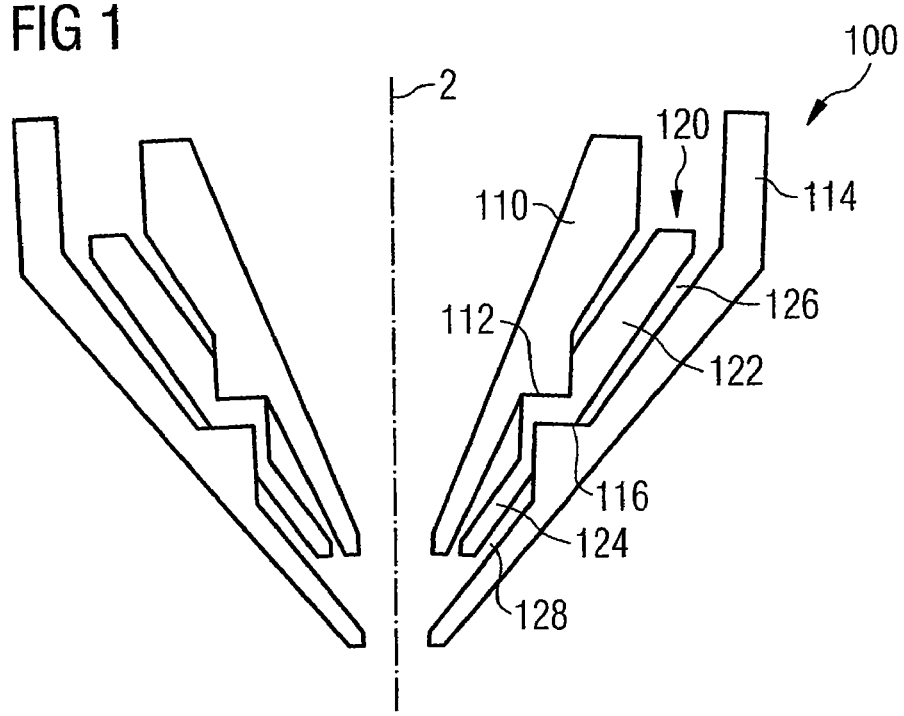
FIG. 1 shows a schematic view of the lens assembly including electrodes and a centering element according to embodiments described herein.

Within FIG. 1, the lens assembly 100 is shown. The lens assembly includes an electrostatic lens component. A first electrode 110 and a second electrode 114 are provided. Typically, the electrodes can be rotationally symmetric and axially symmetric with respect to the optical axis 2. The electrostatic lens is excited by providing two potentials, which are different with respect to each other, to the electrodes. For example, for an electron beam, if the electrode 114 is at the more positive potential as the electrode 110, a retarding lens is provided. According to typical embodiments, the potential difference between the electrodes is in the range of 1 kV to 20 kV, in the range of 5 kV to 10 kV or at 4 to 6 kV.

In order to be able to further improve the resolution of the charged particle beam device, it is desired to provide the dimensions and the alignment of the electrodes with an accuracy in the micrometer range. According to one embodiment, the accuracy of the electrodes, particularly in the region adjacent to the optical axis, is within the range of 1 µm, typically in the range of 1 µm to 10 µm.

Particularly, if a miniaturization of the lens assembly is conducted, the accuracy of the dimensions of the lens assembly should be considered.

According to different embodiments, which are described herein, the dimensions of a typical lens assembly 100 are as follows. The outer diameter, in FIG. 1 at the upper part of the lens assembly 100, can be in the range of 8 mm to 20 mm, typically it can, for example, be 12 mm. The bore diameter, that is the diameter at the region with the smallest diameter, can be in the range of 1 mm to 2 mm and typically, for example, 1.5 mm. For the embodiments described herein, the lens assembly can include conically shaped portions. Thereby, according to further embodiments, the angle of conicity can be in the range of 30° to 60°, typically, for example 45°.

It is to be understood that the term conical or conically is defined herein as a rotational symmetric body with a rotational axis, the body having a first diameter in one plane at a first axis position and a second, larger diameter in a plane at a second axis position. Thereby, typically at least a portion of the conically shaped body includes a portion of a cone.

Within the embodiment described with respect to FIG. 1, the first electrode 110 and second electrode 114 is separated by an insulator 120. The electrode 110 has an insulator receiving portion 112 and the electrode 114 has an insulator receiving portion 116. The insulator receiving portion 112 and the insulator receiving portion 116 are formed such that the insulator 120 can be provided and fixedly secured between the electrodes 110 and 114. In light of the conical portions in each of the insulator and the electrodes, the lens assembly as such can be securely assembled without additional fixing means.

According to one embodiment, the insulator 120 is in contact with the respective electrode, at the respective insulator receiving portion of the electrode. The insulator 120 includes the first extending portion 122 and a second extending portion 124. The extending portions 122 and 124 of the insulator 120 provided a gap of air or vacuum between each of the electrodes and the insulator 120.

The insulator 120 can, according to one embodiment, prevent a sparkover between the two electrodes when biased. In the area of the insulator receiving portions this is achieved by the insulator material itself. In the area of the extending portions 122 and 124 this is provided by the gaps of air, 126 and 128, respectively, and the insulator material itself. Thereby, according to a further embodiment, the length of the insulator 120, that is the sum of the electrode receiving portions, the first extending portion 122 and the second extending portion 124 is in the range of 4 mm to 16 mm, for example, 10 mm. Within FIG. 1, the length is indicated by reference sign L. Thereby, the conductivity along the surface of the insulator can be reduced by the length of the extending portions.

When the first electrode 110 and the second electrode 114 are pre-manufactured and assembled with each other, they need to be aligned in order to provide the desired accuracy. As the requirements for the resolution of the charged particle beam devices increases, the dimensions of the components like lenses shrink and, at the same time, the voltage difference between the electrodes increases. Therefore, it becomes increasingly difficult to design an accurate lens assembly with sufficient insulation for high voltages. This is particularly true for lenses having conically shaped portions, as for example used as an objective lens in a high-resolution scanning electron microscope. According to one embodiment, if the material of the insulator 120 has a sufficiently smaller hardness and/or Young's modulus than the electrodes, the first electrode 110, the second electrode 114 and the insulator 120 can be press-fitted to each other. Thereby, according to one embodiment, the insulator 120 is provided between the two electrodes with a material being a plastic material.

According to embodiments described herein, the insulator 120, the first electrode 110, and the second electrode 114 are rotationally symmetric with respect to the axis of the lens assembly 100, which is indicated as optical axis 2. Thereby, as described above, the elements are conically shaped, that is, include conically shaped portions. The above mentioned length of the two extending portions 122 and 124 are to be understood as the dimension along the outer surface of the conically shape.

The arrangement of the lens assembly 100 as, for example shown in FIG. 1, allows the manufacturing of the dimensions as follows. An outer diameter of the insulator 120, which is adjacent to the respective insulator receiving portion 116 (the vertical part in FIG. 1), can be identical or even slightly larger (for example, ⅟50 mm or ⅟100 mm) than the inner diameter of the corresponding insulator receiving portion 116. The inner diameter (vertical part in FIG. 1) of the insulator 120 can be manufactured to be identical or slightly (for example, ⅟50 mm or ⅟100 mm) smaller than the outer diameter of the respecting insulator receiving portion 112 of the electrode 110. The press-fitting of the insulator 120 and the respective electrode 110, 114, allows for a highly accurate alignment of the lens assembly. Further, the potential difference, for example 5 kV, between the inner electrode and the outer electrode can be sufficiently insulated by the insulator material, the air gap, and the length of the extending portions 122 and 124, which eliminates or reduces the conductivity of the surface conductive path, that is the surface conductive path is chosen to be sufficiently long.

Within the embodiments described herein, the material of the insulator 120, e.g., made of plastic, is softer than the materials used for the first electrode 110 and the second electrode 114. Thus, the material of the insulator has a small hardness, that is, smaller resistance to permanent and, in particular, plastic deformation. Thereby, no damage will occur to the electrodes during press-fitting. According to some embodiments describe herein, a soft material is a material with a hardness and/or the Young's modulus lower than the material of the electrodes. For example, the material of the centering insulator has a hardness and/or the Young's modulus that is at least a factor 10 or typically a factor 50 lower than a hardness and/or Young's modulus of the material of the electrodes.

According to further embodiments described herein, the material of the insulator 120 can be elastic. Thereby, according to even further embodiments, the Young's modulus of the insulator material is in the range of 1 GPa to 20 GPa, or typically 2-4 GPa.

Typical embodiments may include any of the following materials for the insulator 120. The centering element can include Polyetheretherketones (PEEK). Typically a Young's Modulus of PEEK is about 3700 MPa. According to another embodiment, the centering element can include Polyoxymethylene (acetal) (POM) having, for example, a Young's modulus of 2.8 to 3.7 GPa. According to an even further embodiment, the centering ring can include a Polyamide. Polyamides have a Young's modulus in the range of 2.3 GPa. For example, Nylon has a Young's modulus of 2400 MPa.

Other materials, that might according to further embodiments additionally or alternatively be used, are polyimide, PET, epoxide (e.g., epoxy-resin), or the like.

In light of the above it is possible to fit the electrodes in the lens assembly and at the same time provide almost tolerance free alignments between the electrodes. The press-fit will also assure mechanical stability so that no additional fixing elements like screws, bolts, pins, or the like are necessary. Thereby, a compact design allows achieving small dimensions and high-voltage insulation at the same time can be provided.

Figure 2:
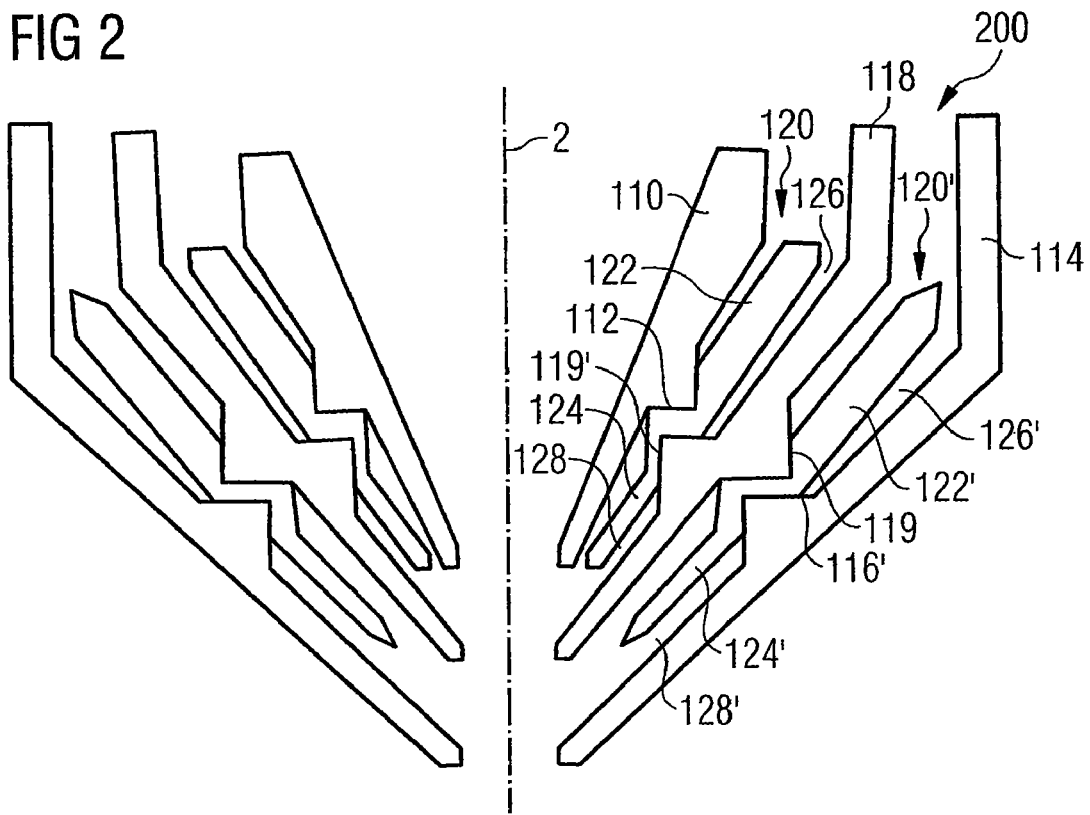
FIG. 2 shows a schematic view of another lens assembly including electrodes and centering elements according to the embodiments described herein.

FIG. 2 shows a further embodiment of a lens assembly 200. According to corresponding embodiments, the first electrode 110, a second electrode 114, and a third electrode 118 are provided. These electrodes correspond to an inner electrode, and outer electrode, and a center electrode, respectively. Further, a first insulator 120 and a second insulator 120' are provided similarly to the embodiments described with respect to FIG. 1.

In particular, the electrostatic lens is excited by providing three potentials to the electrodes. According to one embodiment, the inner and outer electrode may be provided on the same potential in order to provide an Einzel-lens. However, an acceleration lens or a deceleration lens may also be provided. Typically, the center electrode may be on a different potential. According to typical embodiments, the potential difference between at least two of the electrodes is in the range of 1 kV to 20 kV, in the range of 5 kV to 10 kV or at 4 to 6 kV.

In order to be able to further improve the resolution of the charged particle beam device, it is desired to provide the dimensions and the alignment of the electrodes with accuracy in the micrometer range. Particularly, if a miniaturization of the lens assembly is conducted, the accuracy of the dimensions of the lens assembly should be considered. According to one embodiment, the accuracy of the electrodes, particularly in the region adjacent to the optical axis, is within the range of 1 μm, typically in the range of 1 μm to 10 μm.

According to different embodiments, which are described herein, the dimensions of a typical lens assembly 200 are as follows. The outer diameter, in FIG. 2 at the upper part of the lens assembly 200, can be in the range of 8 mm to 20 mm, typically it can, for example, be 16 mm. The bore diameter, that is the diameter at the region with the smallest diameter, can be in the range of 1 mm to 2 mm and typically, for example, 1.5 mm. For the embodiments described herein, the lens assembly is substantially conically shaped. Thereby, according to further embodiments, the angle of conicity can be in the range of 30° to 60°, for example 45°.

Within the embodiment described with respect to FIG. 2, the first electrode 110 and second electrode 114 is separated by an insulator 120. The second electrode 114 and the third electrode 118 are separated by insulator 120'. The electrode 110 has an insulator receiving portion 112 and the electrode 114 has an insulator receiving portion 116. The third electrode has two insulator receiving portions 119 and 119' for receiving the first insulator 120 and the second insulator 120', respectively. The insulator receiving portion 112, the insulator receiving portion 116, and the insulator receiving portions 119 and 199' are formed such that the substantially conically shaped insulators 120 and 120' can be provided and fixedly secured between the substantially conically shaped electrodes 110, 114 and 118. Thereby, the lens assembly as such can be securely assembled without additional fixing means.

According to one embodiment, the insulators 120 and 120' are in contact with the respective electrode, at the respective insulator receiving portion of the electrodes. The first insulator 120 includes the first extending portion 122 and a second extending portion 124. The second insulator 120' includes the first extending portion 122' and a second extending portion 124'. The extending portions 122, 122', 124 and 124' of the insulators 120 and 120' provide a gap of air or vacuum between each of the electrodes and the insulators 120 and 120'.

The insulators 120 and 120' can, according to one embodiment, prevent a sparkover between the two neighboring electrodes when the electrodes are biased. In the area of the insulator receiving portions this is achieved by the insulator material itself. In the area of the extending portions this is provided by the gaps of air, 126, 126', 128 and 128', respectively, and the insulator material itself. Further, according to another embodiment, the length of the insulators, that is the sum of the electrode receiving portions, the respective first extending portion 122 (122') and the second extending portion 124 (124') is in the range of 4 mm to 16 mm, for example, 10 mm. Thereby, the conductivity along the surface of the insulator can be reduced by the length of the extending portions.

When the three electrodes are pre-manufactured and assembled with each other, they need to be aligned in order to provide the desired accuracy. As the requirements for the resolution of the charged particle beam devices increases, the dimensions of the components like lenses shrink and, at the same time, the voltage difference between the electrodes increases. Therefore, it becomes increasingly difficult to design an accurate lens assembly with sufficient insulation for high voltages. This is particularly true for conically shaped lenses, as for example used as an objective lens in a high-resolution scanning electron microscope. According to one embodiment, if the material of the insulators 120 and 120' has a sufficiently smaller hardness and/or Young's modulus than the electrodes the components of the lens assembly can be press-fitted to each other. Thereby, according to one embodiment, the insulator 120 is provided between the first and the third electrode with a material being a plastic material. Further, the insulator 120' is provided between the second and the third electrode with a material being a plastic material. According to one embodiment, the material of the insulators is softer, that is, has a smaller hardness than the electrode material.

Similarly to the embodiments described with respect to FIG. 1, the embodiments described with respect to FIG. 2 allow the manufacturing of the dimensions as follows. An outer diameter of one or both of the insulators, which is adjacent to a respective insulator receiving portion (a vertical part in FIG. 2), can be identical or even slightly larger (for example, 1/50 mm or 1/100 mm) than the inner diameter of the corresponding insulator receiving portion of the respective electrode. The inner diameter (vertical part in FIG. 1) of one or both of the insulators can be manufactured to be identical or slightly (for example, 1/50 mm or 1/100 mm) smaller than the outer diameter of the corresponding insulator receiving portion of the corresponding electrode. The press-fitting of the insulators 120 and 120' and the respective electrodes 110, 114, and 118 allows for a highly accurate alignment of the lens assembly. Further, the potential difference, for example 5 kV, between the two of the electrodes can be sufficiently insulated by the insulator material, the air gap, and the length of the extending portions, which eliminates or reduces the conductivity of the surface conductive path, that is the surface conductive path is chosen to be sufficiently long.

Within the embodiments described herein, the material of the insulators 120 and 120', e.g., made of plastic, is softer than the materials used for the electrodes. Thus, the material of the insulator has a small hardness, that is, smaller resistance to permanent and in particular plastic information. Thereby, no damage will occur to the electrodes during press-fitting. According to one embodiment, a hardness and/or the Young's modulus of the centering insulator is at least a factor 10 or typically a factor 50 lower than a hardness and/or Young's modulus of the material of the electrodes.

According to further embodiments described herein, the material of the insulators 120 and 120' can be elastic. Thereby, according to even further embodiments, the Young's modulus of the material of the insulators is in the range of 1 GPa to 20 GPa, or typically 2-4 GPa.

Typical embodiments may include any of the following materials for the insulators 120 and 120'. The centering element can include Polyetheretherketones (PEEK). Typically a Young's Modulus of PEEK is about 3700 MPa. According to another embodiment, the centering element can include Polyoxymethylene (acetal) (POM) having, for example, a Young's modulus of 2.8 to 3.7 GPa. According to an even further embodiment, the centering ring can include a Polyamide. Polyamides have a Young's modulus in the range of 2.3 GPa. For example, Nylon has a Young's modulus of 2400 MPa. Other materials, that might according to further embodiments additionally or alternatively be used, are polyimide, PET, epoxide (e.g., epoxy-resin), or the like.

In light of the above it is possible to fit the electrodes in the lens assembly and at the same time provide almost tolerance free alignments between the electrodes. The press-fit will also assure mechanical stability so that no additional fixing elements like screws, bolts, pins, or the like are necessary. Thereby, a compact design allows achieving small dimensions and high-voltage insulation at the same time can be provided.

Figure 3:
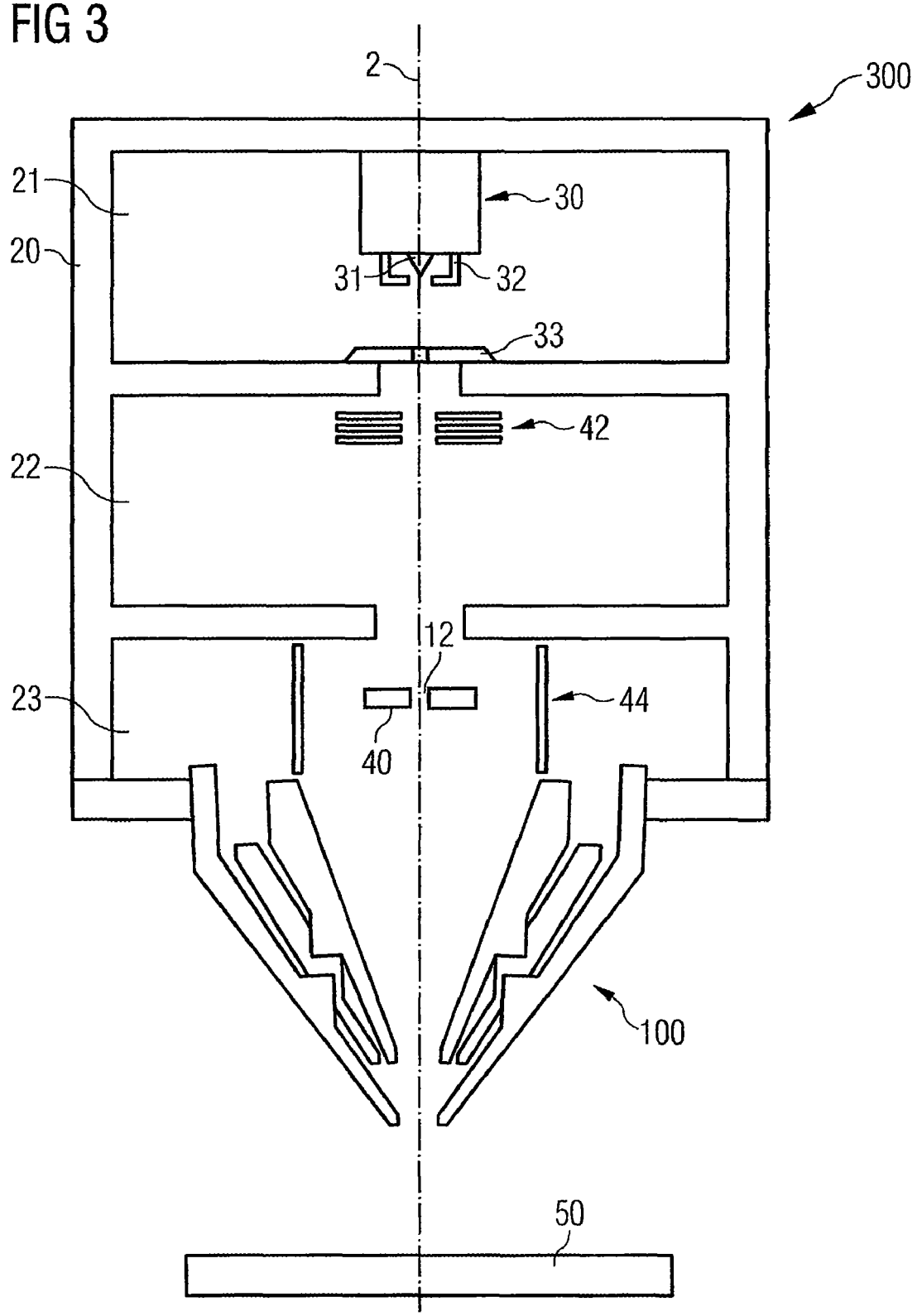
FIG. 3 shows a charged particle beam device including a lens assembly according to embodiments described herein.

Within FIG. 3, a charged particle beam device 300 is shown. Electron beam device with column 20 can be a scanning electron beam microscope. Electron gun 30 includes an emitter 31 and suppressor 32. The primary beam is emitted essentially along optical axis 2. The gun chamber housing 21 is separated by aperture 33 from the following chamber 22. The aperture 33 can also act as an anode. The primary electron beam is formed and guided by condenser lens 42 and beam guiding tubes 44. The beam guiding tubes are for example, provide such that they end close to the inner electrode of the lens assembly 100. Thereby, the potential of the outer electrode, or, if present, a center electrode, can be shielded. The primary electron beam passes through the opening 12 in detector 40 and is focused by objective lens 100. According to one embodiment, lens assembly 100 is supported with a holding member at the outer electrode.

The specimen 50 is provided below the objective lens. Within the embodiment of FIG. 3, lenses can be provided according to any of the embodiments described herein. For example, objective lens 100 can be provided as described with respect to FIGS. 1 and 2.

As described above, embodiments of lens assemblies described herein include lens assemblies having an electrostatic lens component for a charged particle beam system. They can include a first electrode having a conically shaped portion, a second electrode having a conically shaped portion, and a first insulator having a conically shaped portion, wherein the first insulator includes two extending portions towards each of its ends, and wherein the two extending portions are formed to generate a gap between the insulator and each of the adjacent electrodes.

According to other embodiments, lens assemblies can include a first electrode having a conically shaped portion, a second electrode having a conically shaped portion, and a first insulator having a conically shaped portion, wherein the insulator includes a material that has a smaller hardness and/or Young's modulus than the material of the first and the material of the electrode.

According to further embodiments, which can be obtained by modification of any of the other embodiments described herein, the first electrode and the second electrode each includes an insulator receiving portion adapted for alignment with the first insulator. Additionally or alternatively, the insulator receiving portions are adapted for press-fitting with the first insulator.

Yet according to further embodiments, which can be obtained by modification of any of the other embodiments described herein, the two extending portions of the first insulator each have a length of at least 1 mm, at least 3 mm, or at least 5 mm, or have a combined length of at least 4 mm. Thereby, a sufficiently long surface conductive path for insulating the potential difference between the electrodes can be provided. According to different embodiments, which can be combined with other embodiments described herein, the respective surface conductive paths of the first extending portion and the second extending portion are at least 2 mm or typically between 2 mm and 10 mm, e.g., between 2 mm and 5 mm.

Yet according to further embodiments, which can be obtained by modification of any of the other embodiments described herein, the first insulator includes a material with a smaller hardness than the hardness of any of the materials of the first or second electrode. As an example this can be a plastic material. Further, it is possible that the first insulator is elastic. According to further embodiments it can include a material selected from the group consisting of: POM, Polyamide, PEEK, polyimide, PET, epoxide, and combinations thereof.

According to even further embodiments, a lens assembly can further include a third electrode having a conically shaped portion, a second insulator having a conically shaped portion, wherein the second insulator includes two extending portions towards each of its ends, and wherein the two extending portions are formed to generate a gap between the insulator and each of the adjacent electrodes. In order to obtain even further embodiments, the properties, details, or features of any of the first and second electrodes and the first insulator can correspondingly be applied to the third electrode and second insulator, respectively.

According to yet further embodiments, the embodiments described herein can be modified by providing them in a combined electrostatic magnetic lens and/or in a charged particle beam device. Further, embodiments are also directed to method, which may include: providing an electrode having a conically shaped portion and a second electrode having a conically shaped portion, and aligning the first and second electrode with an insulator includes a material that has a smaller hardness and/or Young's modulus than the material of the first and the material of the electrode. Additionally, the first electrode and the second electrode can be aligned by press-fitting insulator between the first electrode and the second electrode.

Yet according to further embodiments, which can be obtained by modification of any of the other embodiments described herein, the method can include: forming a surface conductive path from an insulator receiving portion of the first electrode to an insulator receiving portion of a second electrode with a length of at least 8 mm.

While the foregoing is directed to embodiments of the invention, other and further embodiments of the invention may be devised without departing from the basic scope thereof, and the scope thereof is determined by the claims that follow.

The invention claimed is:

1. Lens assembly having an electrostatic lens component for a charged particle beam system, comprising:
    a first electrode having a conically shaped portion;
    a second electrode having a conically shaped portion; and
    a first insulator having a conically shaped portion, wherein the first insulator comprises two extending portions towards each of its ends, and wherein the two extending portions are formed to generate a gap between the first insulator and each of the adjacent electrodes.

2. Lens assembly according to claim 1, wherein the first electrode and the second electrode each comprise an insulator receiving portion adapted for alignment with the first insulator.

3. Lens assembly according to claim 2, wherein the insulator receiving portions are adapted for press-fitting with the first insulator.

4. Lens assembly according to claim 1, wherein the two extending portions of the first insulator each have a length of at least 1 mm.

5. Lens assembly according to claim 1, wherein the two extending portions of the first insulator each have a length such that the surface conductive paths, respectively, are at least 2 mm.

6. Lens assembly according to claim 1, wherein an electrode receiving portion of the first insulator and the two extending portions of the first insulator have a combined length of at least 4 mm.

7. Lens assembly according to claim 1, wherein the first insulator comprises material with a smaller hardness than the hardness of any of the materials of the first or second electrode.

8. Lens assembly according to claim 1, wherein the first insulator comprises a plastic material.

9. Lens assembly according to claim 1, wherein the first insulator is more elastic than the electrode.

10. Lens assembly according to claim 1, wherein the first insulator comprises at least one material selected from the group consisting of: POM, Polyamide, PEEK, PET, polyimide, epoxide, and combinations thereof.

11. Lens assembly according to claim 7, wherein the first insulator has a Young's modulus of 2 GPa to 4 GPa.

12. Lens assembly according to claim 1, wherein the first insulator has an outer diameter that is about 1/100 mm larger than an inner diameter of a corresponding insulator receiving portion and an inner diameter that is about 1/100 mm smaller than an outer diameter of a corresponding insulator receiving portion.

13. Lens assembly according to claim 1, further comprising:
    a third electrode having a conically shaped portion; and
    a second insulator having a conically shaped portion, wherein the second insulator comprises two extending portions towards each of its ends, and wherein the two extending portions are formed to generate a gap between the second insulator and each of the adjacent electrodes.

14. Lens assembly according to claim 13, wherein the first electrode, the second electrode, and the third electrode each comprise an insulator receiving portion adapted for alignment with the first insulator.

15. Lens assembly according to claim 14, wherein the insulator receiving portions are adapted for press-fitting with the first insulator.

16. Lens assembly according to claim 13, wherein an electrode receiving portion of the second insulator and the two extending portions of the second insulator have a combined length of at least 4 mm.

17. Lens assembly according to claim 13, wherein the second insulator comprises a plastic material.

18. Lens assembly according to claim 13, wherein the second insulator comprises at least one material selected from the group consisting of: POM, Polyamide, PEEK, PET, polyimide, epoxide, and combinations thereof.

19. Lens assembly according claim 1, further comprising:
    a magnetic lens assembly such that the magnetic lens assembly and the electrostatic lens component form a compound magnetic electrostatic lens.

20. Lens assembly according to claim 1, wherein the lens assembly is substantially conically shaped.

21. Charged particle beam device, comprising:
    a lens assembly having an electrostatic lens component for a charged particle beam system, the lens assembly comprising:
        a first electrode having a conically shaped portion;
        a second electrode having a conically shaped portion; and
        an insulator having a conically shaped portion, wherein the first insulator comprises two extending portions towards each of its ends, and wherein the two extending portions are formed to generate a gap between the insulator and each of the adjacent electrodes.

22. Charged particle beam device according to claim 21, wherein the lens assembly is an objective lens in the charged particle beam device.

23. Method of manufacturing a lens assembly having a magnetic lens assembly for a charged particle beam system, comprising:
    providing a first electrode having a conically shaped portion and a second electrode having a conically shaped portion; and
    aligning the first and second electrode with an insulator comprising a material that has a smaller Young's modulus than the material of the first electrode and the material of the second electrode, wherein the insulator has a conically shaped portion and comprises two extending portions towards each of its ends, and wherein the two extending portions are formed to generate a gap between the insulator and each of the adjacent electrodes.

24. Method of manufacturing a lens assembly according to claim 23, wherein the first electrode and the second electrode are aligned by press-fitting the insulator between the first electrode and the second electrode.

25. Method of manufacturing a lens assembly according to claim 23, further comprising:
    forming a surface conductive path from an insulator receiving portion of the first electrode to an insulator receiving portion of the second electrode with a length of at least 2 mm.

* * * * *

UNITED STATES PATENT AND TRADEMARK OFFICE
CERTIFICATE OF CORRECTION

| | | |
|---|---|---|
| PATENT NO. | : 7,872,239 B2 | Page 1 of 1 |
| APPLICATION NO. | : 12/181171 | |
| DATED | : January 18, 2011 | |
| INVENTOR(S) | : Adamec et al. | |

It is certified that error appears in the above-identified patent and that said Letters Patent is hereby corrected as shown below:

In the Claims:

Column 10, Claim 21, Line 29, please delete "first".

Signed and Sealed this
Thirtieth Day of August, 2011

David J. Kappos
*Director of the United States Patent and Trademark Office*